(12) United States Patent
Haramoto

(10) Patent No.: US 6,838,129 B2
(45) Date of Patent: Jan. 4, 2005

(54) METHOD AND DEVICE FOR TRANSPORTING AN ELECTRICAL CHARGE

(75) Inventor: Yuichiro Haramoto, Yamanashi (JP)

(73) Assignee: Nippon Chemical Industrial Co., Ltd., Tokyo (JP)

( * ) Notice: Subject to any disclaimer, the term of this patent is extended or adjusted under 35 U.S.C. 154(b) by 0 days.

(21) Appl. No.: 10/296,226

(22) PCT Filed: May 31, 2001

(86) PCT No.: PCT/JP01/04621
§ 371 (c)(1),
(2), (4) Date: Dec. 4, 2002

(65) Prior Publication Data
US 2003/0160211 A1 Aug. 28, 2003

(30) Foreign Application Priority Data
Jun. 5, 2000 (JP) .................................... 2000-168057

(51) Int. Cl.⁷ .................... C09K 19/58; C09K 19/34
(52) U.S. Cl. ................ 428/1.1; 252/299.3; 252/299.61
(58) Field of Search ................ 428/1.1; 252/299.3, 252/299.61; 349/69

(56) References Cited

FOREIGN PATENT DOCUMENTS

| JP | 11-260428 | | 9/1999 |
| JP | 30 26185 B2 | | 1/2000 |
| JP | 2000-68052 | * | 3/2000 |

OTHER PUBLICATIONS

English translation by computer for JP 2000–68052, http://www6.ipdl.jpo.go.jp/Tokujitu/PAJdetail.ipdl?N0000=80&N0120=01&N2001=2&N3001=2000–068052.*

* cited by examiner

Primary Examiner—Shean C. Wu
(74) Attorney, Agent, or Firm—Armstrong, Kratz, Quintos, Hanson & Brooks, LLP

(57) ABSTRACT

An electric charge transport method with a high current density and excellent charge transporting capability is provided. Specifically, the charge transport method includes applying a voltage to a liquid crystalline compound in a smectic B liquid crystal phase, which liquid crystalline compound exhibits a smectic B phase as a liquid crystal phase, or applying a voltage to a liquid crystalline compound in a solid state formed as a result of phase transition from a smectic phase, which liquid crystalline compound exhibits the smectic phase as a liquid crystal phase.

9 Claims, 7 Drawing Sheets

METHOD AND DEVICE FOR TRANSPORTING AN ELECTRICAL CHARGE

TECHNICAL FIELD

The present invention relates to novel electrical charge transport methods and charge transport devices using liquid crystalline compounds.

BACKGROUND ART

Investigations on organic electroluminescent devices using organic materials as electron hole transport materials and electric charge (hereafter simply referred to as charge) transport materials constituting electroluminescent devices have been actively pursued in recent years.

As conventional charge transport materials, anthracene derivatives, anthraquinone derivatives, imidazole derivatives, styryl derivatives, hydrazine derivatives, triphenylamine compounds, poly(N-vinylcarbazole), oxadiazole, and other compounds are known.

Liquid crystalline compounds are applied, as display materials, to various apparatus such as clocks, electronic desk-top calculators, television sets, personal computers, and cellular phones. Liquid crystalline substances are categorized as thermotropic liquid crystals and lyotropic liquid crystals based on their phase transition means. From the viewpoint of molecular alignment, these liquid crystals are categorized into three groups, namely smectic liquid crystals, nematic liquid crystals, and cholesteric liquid crystals. The liquid crystals have a synonym of anisotropic liquids and are optically anisotropic as in optically uniaxial crystals. Orthoscopic observation is observation performed between regular crossed nicols and is useful for the identification of the types of liquid crystals or for the determination of transition temperatures of liquid crystal phases. The individual liquid crystals show characteristic birefringent optical patterns upon the orthoscopic observation, and the smectic crystals are further categorized as A, B, C, D, E, F, G and other smectic phases.

Hanna et al. have found liquid crystalline compounds having a smectic liquid crystal phase are capable of transporting charges and have proposed charge transport materials using these liquid crystalline compounds. They have proposed, for example, a liquid crystalline charge transport material exhibiting smectic liquid crystallinity and having a reduction potential with respect to a standard calomel electrode (SCE) in the range of from −0.3 to −0.6 (V vs. SCE) (Japanese Patent Laid open No. 09-316442), a liquid crystalline charge transport material comprising a liquid crystalline compound exhibiting a smectic phase having self-orientation properties and a predetermined amount of fullerene C70 capable of sensitizing (Japanese Patent Laid open No. 11-162648), a high polymer membrane comprising a liquid crystalline charge transport material dispersed therein in which a liquid crystalline compound exhibiting a smectic phase is dispersed in an organic polymeric matrix (Japanese Patent Laid open No. 11-172118), a liquid crystalline charge transport material comprising a mixture containing a smectic liquid crystalline compound (Japanese Patent Laid open No. 11-199871), a liquid crystalline charge transport material having smectic liquid crystallinity and an electron mobility or electron hole mobility of not less than $1 \times 10^{-5}$ $cm^2/v.s$ (Japanese Patent Laid open No. 10-312711), and a liquid crystalline charge transport material comprising a smectic liquid crystalline compound having, in one molecule, a functional group capable of forming a new intermolecular or intramolecular bond and a functional group capable of transporting holes and/or electron charges (Japanese Unexamined Patent Application Publication No. 11-209761).

The above-proposed smectic liquid crystalline compounds are smectic liquid crystalline compounds having 6 π-electron aromatic rings such as benzene ring, pyridine ring, pyrimidine ring, pyridazine ring, pyrazine ring, tropolone ring, and compounds having 10 π-electron aromatic rings such as naphthalene ring, azulene ring, benzofuran ring, indole ring, indazole ring, benzothiazole ring, benzoxazole ring, benzimidazole ring, quinoline ring, isoquinoline ring, quinazoline ring, quinoxaline ring, and compounds having 14 π-electron aromatic rings such as phenanthrene ring, anthracene ring, and others. These compounds are used for charge transporting in a smectic A liquid crystal phase. Such charge transporting with the aid of smectic A phase is charge transporting using spread of a conjugated system in the molecule. Accordingly, none of these compounds can exhibit excellent charge transporting capability unless they are excited by, for example, light. In addition, they have a low current density, at most on the order of nanoamperes per square centimeter.

DISCLOSURE OF INVENTION

The present invention has been accomplished in view of these conventional technologies, and an object of the present invention is to provide a method and device for transporting an electric charge which exhibit a high current density and have excellent charge transporting capability by applying a voltage to a liquid crystalline compound in a smectic B liquid crystal phase, which liquid crystalline compound exhibits a smectic B phase as a liquid crystal phase.

Another object of the present invention is to provide a charge transport method and a charge transport device which exhibit a high current density and have excellent charge transporting capability by applying a voltage to a liquid crystalline compound in a solid state formed as a result of phase transition from a smectic phase induced by temperature depression, which liquid crystalline compound exhibits the smectic phase as a liquid crystal phase.

Specifically, the first invention of the present invention is a charge transport method comprising the step of applying a voltage to a liquid crystalline compound in a smectic B liquid crystal phase, which liquid crystalline compound exhibits the smectic B phase as a liquid crystal phase.

The second invention of the present invention is a charge transport method comprising the step of applying a voltage to a liquid crystalline compound in a solid state formed as a result of phase transition from a smectic phase, which liquid crystalline compound exhibits the smectic phase as a liquid crystal phase.

The liquid crystalline compounds are preferably smectic liquid crystalline compounds each having a strongly basic moiety in their skeleton.

The third invention of the present invention is a charge transport device comprising a pair of substrates each having an electrode; a liquid crystal layer sandwiched between the substrates and comprising a liquid crystalline compound exhibiting a smectic B phase as a liquid crystal phase; and means for applying a voltage to the liquid crystalline compound in a smectic B liquid crystal phase to thereby transport charges through the liquid crystal layer.

In addition, a fourth invention of the present invention is a charge transport device comprising a pair of substrates each having an electrode; a liquid crystal layer sandwiched between the substrates and comprising a liquid crystalline compound exhibiting a smectic phase as a liquid crystal phase; and means for applying a voltage to the liquid crystalline compound in a solid state formed as a result of phase transition from the smectic phase to thereby transport charges through the liquid crystal layer.

Figure 1:
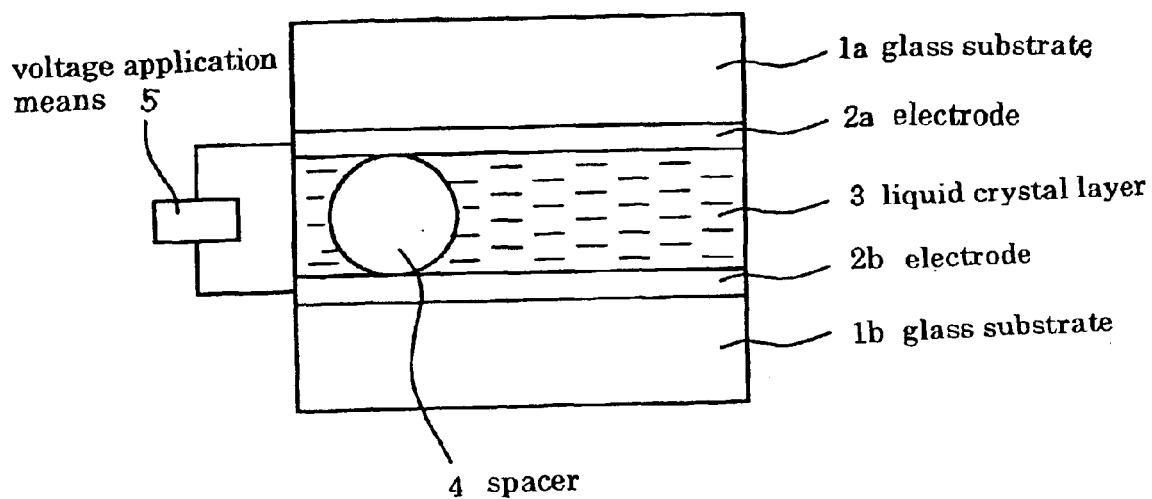
FIG. 1 is a schematic diagram of a charge transport device as an embodiment of the present invention.

In the figures, 1a and 1b are glass substrates, 2a and 2b are electrodes, 4 is a spacer, 3 and 13 are liquid crystal layers, and 5 is a voltage application means, respectively.

BEST MODE FOR CARRYING OUT THE INVENTION

The present invention will be illustrated in further detail below.

The charge transport method according to the first invention of the present invention comprises the step of applying a voltage to a liquid crystalline compound in a smectic B liquid crystal phase, which liquid crystalline compound exhibits the smectic B phase as a liquid crystal phase.

The charge transport method of the present invention has been accomplished based on the following novel findings. Specifically, when a voltage is applied to a liquid crystalline compound in a smectic B liquid crystal phase where the liquid crystalline compound exhibits the smectic B phase as a liquid crystal phase, the liquid crystalline compound shows higher charge transporting capability only by the application of a voltage without photo-induced excitation. Particularly, when a liquid crystalline compound having a strongly basic moiety in its skeleton is used, liquid crystal molecules each having the strongly basic moiety, namely a moiety with high electron density are overlapped in the smectic B liquid crystal phase where molecules overlap densely. By this configuration, the method can transport charges at a high current density at least on the order of microamperes per square centimeter without the wide spreading of a conjugated system as in a smectic A phase, in contrast to conventional charge transport materials.

Liquid crystals for use in the charge transport method of the present invention are not specifically limited as long as they are liquid crystalline compounds exhibiting smectic B phase as a liquid crystal phase, and known compounds can be used. Such liquid crystalline compounds exhibiting a smectic B phase can be whichever liquid crystalline compound exhibits a smectic B phase alone as a liquid crystal phase or those exhibiting other smectic phase(s) in addition to the smectic B phase. For example, the liquid crystalline compounds may be those exhibiting A phase and B phase, those exhibiting A phase, B phase, and C phase, and any other liquid crystalline compounds exhibiting smectic B phase. The liquid crystalline compounds may also be polymeric liquid crystalline compounds exhibiting smectic B phase.

Among the liquid crystalline compounds having a smectic B phase for use in the charge transport method of the present invention, preference is given to those having a strongly basic moiety in their skeletons, of which those having a monocyclic heterocycle in its skeleton are especially preferred.

Preferred monocyclic heterocycles include, for example, piperidine, piperazine, pyridine, pyridazine, pyrimidine, and pyrazine. Among them, liquid crystalline compounds having piperazine in their skeletons are especially preferred.

More specifically, piperazine-containing liquid crystalline compounds represented by the following general formula (1) are more preferred.

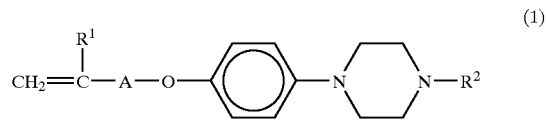

(1)

In general formula (1) representing the piperazine-containing liquid crystalline compounds, $R^1$ is a hydrogen atom or a methyl group.

$R^2$ is a straight- or branched-chain alkyl group containing from 1 to 22 carbon atoms, such as methyl group, ethyl group, propyl group, butyl group, octyl group, decyl group, dodecyl group, and octadecyl group. Among them, those containing from 8 to 14 carbon atoms are especially preferred.

A is an alkylene group, and preference is given to those containing from 6 to 10 carbon atoms. Examples of such alkylene groups are methylene groups, ethylene groups, trimethylene groups, tetramethylene groups, pentamethylenes groups, ethylethylene groups, propylene groups, butylene groups, hexylene groups, octadecylene groups, nonylene groups, decylene groups, and dodecylene groups.

Preferred examples of the piperazine-containing liquid crystalline compounds represented by general formula (1) include:
1-[4-(6-heptenyloxy)phenyl]-4-octylpiperazine,
1-[4-(6-heptenyloxy)phenyl]-4-nonylpiperazine,
1-[4-(6-heptenyloxy)phenyl]-4-decylpiperazine,
1-[4-(6-heptenyloxy)phenyl]-4-undecylpiperazine,
1-[4-(6-heptenyloxy)phenyl]-4-dodecylpiperazine,
1-[4-(6-heptenyloxy)phenyl]-4-tridecylpiperazine,
1-[4-(6-heptenyloxy)phenyl]-4-tetradecylpiperazine,
1-[4-(6-heptenyloxy)phenyl]-4-pentadecylpiperazine,
1-[4-(6-heptenyloxy)phenyl]-4-hexadecylpiperazine,
1-[4-(6-heptenyloxy)phenyl]-4-heptadecylpiperazine,
1-[4-(6-heptenyloxy)phenyl]-4-octadecylpiperazine,
1-[4-(7-octenyloxy)phenyl]-4-octylpiperazine,
1-[4-(7-octenyloxy)phenyl]-4-nonylpiperazine,
1-[4-(7-octenyloxy)phenyl]-4-decylpiperazine,
1-[4-(7-octenyloxy)phenyl]-4-undecylpiperazine,
1-[4-(7-octenyloxy)phenyl]-4-dodecylpiperazine,
1-[4-(7-octenyloxy)phenyl]-4-tridecylpiperazine,
1-[4-(7-octenyloxy)phenyl]-4-tetradecylpiperazine,
1-[4-(7-octenyloxy)phenyl]-4-pentadecylpiperazine,
1-[4-(7-octenyloxy)phenyl]-4-hexadecylpiperazine,
1-[4-(7-octenyloxy)phenyl]-4-heptadecylpiperazine, 1-[4-(7-octenyloxy)phenyl]-4-octadecylpiperazine,
1-[4-(8-nonenyloxy)phenyl]-4-octylpiperazine,
1-[4-(8-nonenyloxy)phenyl]-4-nonylpiperazine,
1-[4-(8-nonenyloxy)phenyl]-4-decylpiperazine,
1-[4-(8-nonenyloxy)phenyl]-4-undecylpiperazine,
1-[4-(8-nonenyloxy)phenyl]-4-dodecylpiperazine,
1-[4-(8-nonenyloxy)phenyl]-4-tridecylpiperazine,
1-[4-(8-nonenyloxy)phenyl]-4-tetradecylpiperazine,
1-[4-(8-nonenyloxy)phenyl]-4-pentadecylpiperazine,
1-[4-(8-nonenyloxy)phenyl]-4-hexadecylpiperazine,
1-[4-(8-nonenyloxy)phenyl]-4-heptadecylpiperazine,
1-[4-(8-nonenyloxy)phenyl]-4-octadecylpiperazine,
1-[4-(9-decenyloxy)phenyl]-4-octylpiperazine,
1-[4-(9-decenyloxy)phenyl]-4-nonylpiperazine,
1-[4-(9-decenyloxy)phenyl]-4-decylpiperazine,
1-[4-(9-decenyloxy)phenyl]-4-undecylpiperazine,
1-[4-(9-decenyloxy)phenyl]-4-dodecylpiperazine,
1-[4-(9-decenyloxy)phenyl]-4-tridecylpiperazine,
1-[4-(9-decenyloxy)phenyl]-4-tetradecylpiperazine,
1-[4-(9-decenyloxy)phenyl]-4-pentadecylpiperazine,
1-[4-(9-decenyloxy)phenyl]-4-hexadecylpiperazine,
1-[4-(9-decenyloxy)phenyl]-4-heptadecylpiperazine,
1-[4-(9-decenyloxy)phenyl]-4-octadecylpiperazine,
1-[4-(10-undecenyloxy)phenyl]-4-octylpiperazine,
1-[4-(10-undecenyloxy)phenyl]-4-nonylpiperazine,
1-[4-(10-undecenyloxy)phenyl]-4-decylpiperazine,
1-[4-(10-undecenyloxy)phenyl]-4-undecylpiperazine,
1-[4-(10-undecenyloxy)phenyl]-4-dodecylpiperazine,
1-[4-(10-undecenyloxy)phenyl]-4-tridecylpiperazine,
1-[4-(10-undecenyloxy)phenyl]-4-tetradecylpiperazine,
1-[4-(10-undecenyloxy)phenyl]-4-pentadecylpiperazine,
1-[4-(10-undecenyloxy)phenyl]-4-hexadecylpiperazine,
1-[4-(10-undecenyloxy)phenyl]-4-heptadecylpiperazine, and
1-[4-(10-undecenyloxy)phenyl]-4-octadecylpiperazine.

The piperazine-containing liquid crystalline compounds represented by general formula (1) can be prepared, for example, according to the following reaction formulae (1) and (2):

Reaction Formula (1)

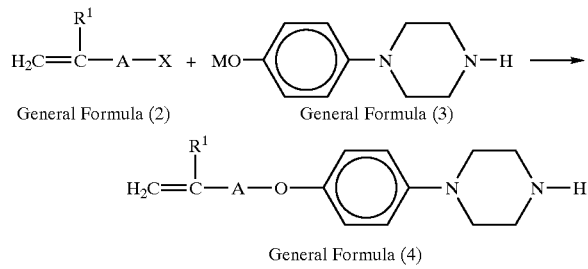

Reaction Formula (2)

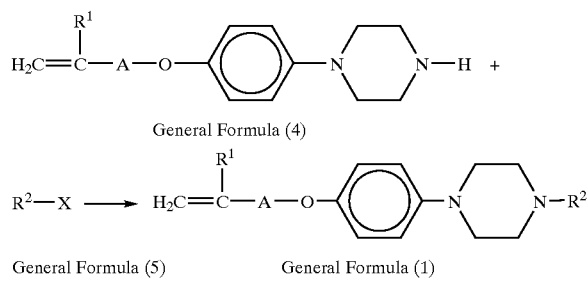

wherein $R^1$ and $R^2$ have the same meanings as defined above; X is a halogen atom such as a chlorine atom and fluorine atom; and M is an alkali metal such as potassium and sodium.

Specifically, according to reaction formula (1), a piperazine derivative represented by general formula (4) can be easily obtained by reacting a halide represented by general formula (2) with an alcoholate represented by general formula (3) in an organic solvent.

The molar ratio of the alcoholate of general formula (3) to the halide of general formula (2) is generally from 1 to 4, and preferably from 1 to 2. The reaction temperature is generally from 0° C. to 100° C. and preferably from 10° C. to 40° C., and the reaction time is generally from 1 to 50 hours and preferably from 10 to 30 hours.

Reaction solvents are not specifically limited, as long as they can dissolve the halide and alcoholate and are inert, and include, for example, toluene, xylenes, benzene, and other aromatic hydrocarbons; 1,1,1-trichloroethane, 1,1,2-trichloroethane, 1,1,1,2-tetrachloroethane, 1,1,2,2-tetrachloroethane, and other haloalkanes; and N,N-dimethylformamide. Each of these solvents can be used alone or in combination. After the completion of the reaction, the piperazine derivative represented by general formula (4) is obtained according to a conventional purification procedure such as extraction and recrystallization.

Next, according to the reaction shown in reaction formula (2), a piperazine-containing liquid crystalline compound represented by general formula (1) can be easily prepared by reacting the piperidine derivative represented by general formula (4) with an alkyl halide represented by general formula (5) in an organic solvent in the presence of a base.

The molar ratio of the alkyl halide represented by general formula (5) to the piperidine derivative represented by general formula (4) is generally from 1 to 4 and preferably from 1 to 2. The reaction temperature is generally from 0° C. to 100° C. and preferably from 20° C. to 80° C., and the reaction time is generally from 1 to 60 hours and preferably from 24 to 50 hours.

Examples of the base include, but are not limited to, sodium hydroxide, sodium carbonate, sodium hydrogencarbonate, potassium hydroxide, potassium carbonate, potassium hydrogencarbonate, calcium hydroxide, calcium carbonate, and other inorganic bases; trimethylamine, N,N-dimethylcyclohexylamine, N,N-diethylcyclohexylamine, N,N-dimethylbenzylamine, N,N'-dimethylpiperazine, N,N-dimethylaniline, N,N-diethylaniline, N,N,N', N'-tetramethyl-1,3-propanediamine, pyridine, α-picoline, β-picoline, γ-picoline, 4-ethylmorpholine, triethylenediamine, 1,3-diazabicyclo[5,4,0]undecene, 1,8-diazabicyclo[5,4,0]-7-undecene, N-ethylpiperidine, quinoline, isoquinoline, N,N-dimethylpiperazine, N,N-diethylpiperazine, quinaldine, 2-ethylpyridine, 4-ethylpyridine, 3,5-lutidine, 2,6-lutidine, 4-methylmorpholine, 2,4,6-collidine, and other organic bases; and ion exchange resins each having pyridyl group or methylaminobenzyl group.

The amount of the base has only to be an amount sufficient to capture a hydrogen halide formed as by-product and is generally from 1 to 6 times, preferably from 1 to 3 times, and more preferably from 1.1 to 2 times the stoichiometric amount of the by-produced hydrogen halide.

Reaction solvents for use herein are not specifically limited, as long as they can dissolve the alkyl halide and the piperidine derivative represented by general formula (4) and are inert, and include, for example, dioxane, tetrahydrofuran, dibutyl ether, and other ethers; acetonitrile, propionitrile, N,N-dimethylformamide, and mixtures of these solvents. Each of these solvents can be used alone or in combination.

The reaction can be performed in the presence of a polymerization inhibitor if desired. Such polymerization inhibitors include, but are not limited to, hydroquinone, hydroquinone monomethyl ether, phenothiazine, 2,6-di-tert-butyl-p-cresol, thiourea, urea, and N-phenyl-N'-isopropyl-p-phenyldiamine. The amount of the polymerization inhibitor is from about 100 to about 100000 ppm and preferably from about 500 to about 5000 ppm relative to the amount of the target compound.

After completion of the reaction, the piperazine-containing liquid crystalline compound represented by general formula (1) is obtained according to a conventional purification procedure such as extraction and recrystallization.

By the above process, the piperazine-containing liquid crystalline compound represented by general formula (1) can be easily obtained. The resulting compound has a thermotropically stable liquid crystal phase and exhibits a smectic B phase as a liquid crystal phase.

The piperazine-containing liquid crystalline compound represented by general formula (1) has an unsaturated bond and can yield a polymeric charge transport material as a result of a polymerization reaction.

FIG. 1 is a schematic diagram of a charge transport device as an embodiment of the present invention. With reference to FIG. 1, the charge transport device of the present invention is prepared in the following manner. Initially, electrodes 2a and 2b made of a transparent electrode such as ITO are formed on surfaces of a pair of glass substrates 1a and 1b, respectively. The pair of substrates carrying the electrodes are bonded with each other using an adhesive in such a manner that cell distance is held constant using a spacer 4 to thereby form a cell. Next, the above liquid crystalline compound exhibiting a smectic B phase as a liquid crystal phase is injected into the cell to form a liquid crystal layer 3 between the electrodes, and a voltage application means 5 is connected to the electrodes 2a and 2b. The voltage application means 5 serves to apply a voltage to the liquid crystalline compound in a smectic B liquid crystal phase in the liquid crystal layer 3. Specifically, a voltage is applied to the liquid crystalline compound in a smectic B liquid crystal phase in the liquid crystal layer 3 by a charge transport means comprising the voltage application means 5, a temperature control means (not shown) for the liquid crystal phase, and other components. By this procedure, a high current density is obtained through the liquid crystal layer to thereby transport charges.

The charge transport method and the charge transport device of the present invention transport charges by applying a voltage to a liquid crystalline compound in a smectic B liquid crystal phase, which liquid crystalline compound exhibits the smectic B phase as a liquid crystal phase. Particularly, when a liquid crystalline compound having a strongly basic moiety in its skeleton is used, liquid crystal molecules each having the strongly basic moiety, namely, a moiety with high electron density are overlapped in the smectic B liquid crystal phase where molecules densely overlap with each other. By this configuration, the method can transport charges at a high current density on the order of microamperes per square centimeter without the wide spreading of a conjugated system, in contrast to conventional charge transport materials. Accordingly, the charge transport method and the charge transport device can be advantageously used as charge transport methods and charge transport devices in optical sensors, electroluminescent devices, photoconductors, spatial light modulators, thin film transistors, and other sensors, utilizing their charge transporting capabilities.

The charge transport method according to the second invention of the present invention comprises the step of applying a voltage to a liquid crystalline compound in a solid state formed as a result of phase transition from a smectic phase, which liquid crystalline compound exhibits the smectic phase as a liquid crystal phase.

This charge transport method of the present invention has been accomplished based on the following findings. Specifically, when a liquid crystalline compound exhibiting a smectic phase as a liquid crystal phase is allowed to undergo phase transition into a solid state while the smectic phase is maintained, the resulting liquid crystalline compound includes basic moieties overlapped with a higher density even in a solid state. The resulting liquid crystalline compound can exhibit higher charge transport capability with a high current density only by the application of a voltage without photo-induced excitation.

Liquid crystals for use in the charge transport method of the present invention are not specifically limited, as long as they are liquid crystalline compounds exhibiting a smectic phase, and include known liquid crystalline compounds. Among them, those exhibiting smectic B phase as a liquid crystal phase are preferred. The liquid crystals may also be polymeric liquid crystalline compounds exhibiting a smectic phase.

Among such liquid crystalline compounds exhibiting a smectic phase for use in the charge transport method of the present invention, those having a strongly basic moiety in their skeleton are preferred.

More specifically, examples of such liquid crystalline compounds are liquid crystalline compounds represented by following general formula (6):

$$R^3-A-B-R^4 \qquad (6)$$

In general formula (6), examples of $R^3$ and $R^4$ are as follows:

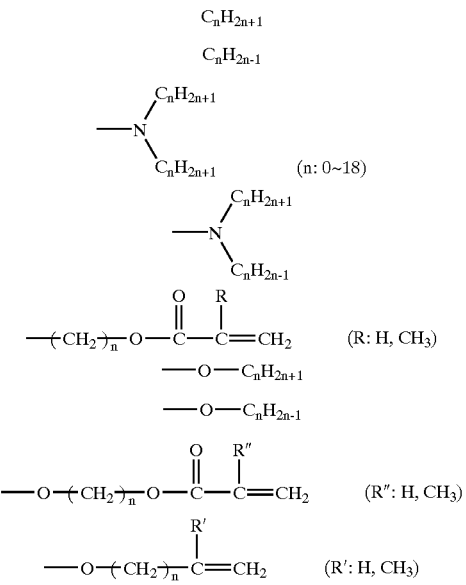

Examples of the group A are as follows:

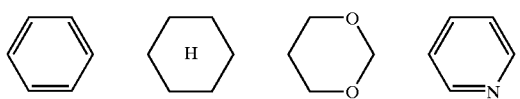

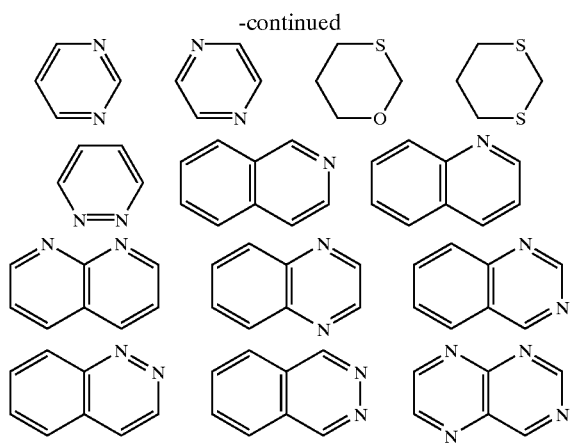

B is a basic ring and includes, for example, the followings:

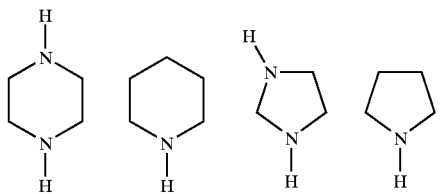

Among the aforementioned liquid crystalline compounds, those having an unsaturated bond can also be used as polymeric charge transport materials as a result of a polymerization reaction.

In charge transportation, a voltage can be applied to the liquid crystalline compound in a solid state formed as a result of phase transition from a smectic phase induced by temperature depression, which liquid crystalline compound exhibits the smectic phase as a liquid crystal phase. Such solid states include, for example, a crystal phase, glassy state, and amorphous solid state.

Figure 2:
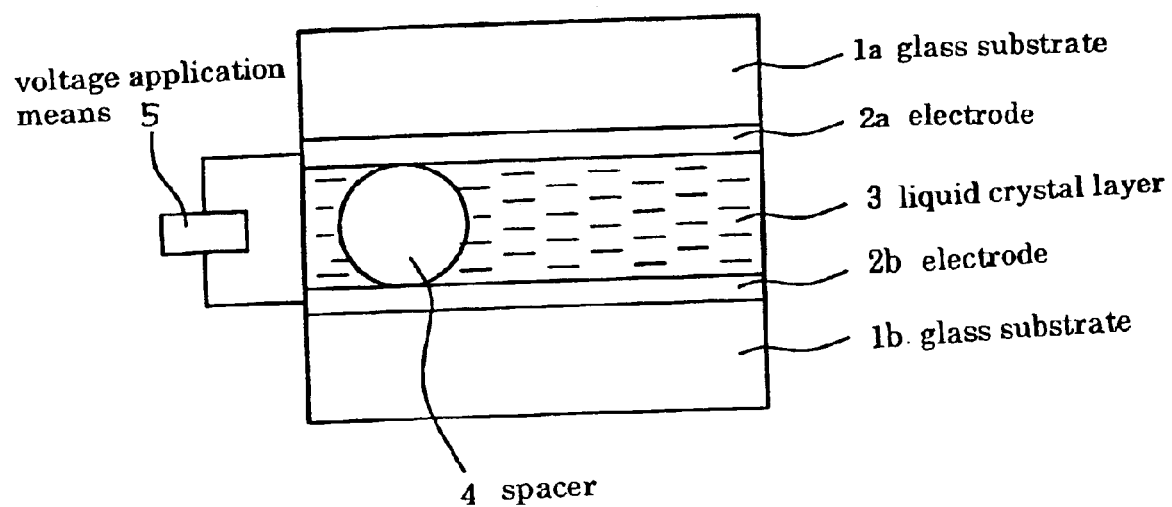
FIG. 2 is a schematic diagram of a charge transport device as another embodiment of the present invention.

FIG. 2 is a schematic diagram of a charge transport device as another embodiment of the present invention. With reference to FIG. 2, the charge transport device of the present invention is prepared in the following manner. Initially, electrodes 2a and 2b made of a transparent electrode such as ITO are formed on surfaces of a pair of glass substrate 1a and 1b, respectively. The pair of substrates carrying the electrodes are bonded with each other using an adhesive in such a manner that a cell distance is held constant using a spacer 4 to thereby form a cell. Next, the above liquid crystalline compound exhibiting a smectic phase as a liquid crystal phase is injected into the cell to form a liquid crystal layer 13 between the electrodes, and a voltage application means 5 is connected to the electrodes 2a and 2b. The voltage application means 5 serves to apply a voltage to the liquid crystalline compound in a solid state formed as a result of phase transition from the smectic phase in the liquid crystal layer 13. Specifically, a voltage is applied to the liquid crystalline compound in the liquid crystal layer 13 in a solid state formed as a result of phase transition from the smectic phase by a charge transport means comprising the voltage application means 5, a temperature control means (not shown) for the liquid crystal phase, and other components. By this procedure, a high current density can be obtained through the liquid crystal layer to thereby transport charges.

The charge transport method and the charge transport device of the present invention transport charges by applying a voltage to a liquid crystalline compound in a solid state formed as a result of phase transition from a smectic phase induced by temperature depression, which liquid crystalline compound exhibits the smectic phase as a liquid crystal phase. In this procedure, the liquid crystalline compound undergoes phase transition to a solid state while keeping the alignment of the smectic phase. Particularly, when a liquid crystalline compound having a strongly basic moiety in its skeleton is used, liquid crystal molecules each having the strongly basic moiety are overlapped with a high density. By this configuration, the method and device can transport charges at a high current density at least on the order of microamperes per square centimeter, and preferably on the order of milliamperes per square centimeter, in contrast to conventional charge transport materials. Accordingly, the charge transport method and the charge transport device can be advantageously used as charge transport methods and charge transport devices in optical sensors, electroluminescent devices, photoconductors, spatial light modulators, thin film transistors, and other sensors, utilizing their charge transporting capabilities.

EXAMPLES

The present invention will be illustrated in further detail with reference to several examples below, which are not intended to limit the scope of the invention.

Reference Example 1
Preparation of 1-[4-(9-decenyloxy)phenyl]-4-octylpiperazine

In 50 mL of methanol was dissolved 0.72 g (0.017 mol) of sodium hydroxide (94%) at room temperature. After cooling, the solution was treated with 3 g (0.017 mol) of 1-(4-hydroxyphenyl)piperazine, and excess methanol was removed under reduced pressure. A total of 3.7 g (0.017 mol) of 10-bromo-1-decene was added to 50 mL of N,N-dimethylformamide and was stirred at room temperature for 24 hours. The resulting solution was poured into 300 mL of ice water, was extracted with two portions of 300 mL of diethyl ether, was washed with 300 mL of distilled water, and was then dehydrated over anhydrous sodium sulfate overnight. After filtration, the solution was diluted with hexane and was separated into soluble matters and insoluble matters. The hexane-soluble matters were then recrystallized from ether and hexane (1:3) and thereby yielded 1-[4-(9-decenyloxy)phenyl]piperazine.

A total of 0.2 g of a polymerization inhibitor (phenothiazine) was dissolved in N,N-dimethylformamide. To the resulting solution were added and dissolved 0.62 g (0.0032 mol) of octyl bromide, 2.5 g (0.016 mol) of 1,8-diazabicyclo[5.4.0]-7-undecene (DBU), and 1 g (0.0032 mol) of the above-prepared 1-[4-(9-decenyloxy)phenyl]piperazine, followed by a reaction at 60° C. in an atmosphere of nitrogen gas for 48 hours with stirring. After completion of the reaction, the solution was poured into ice water, extracted with two portions of 300 mL of diethyl ether, washed with 300 mL of distilled water and dehydrated over anhydrous sodium sulfate overnight. After filtration, the solution was diluted with hexane and separated into soluble matters and insoluble matter. The hexane-soluble matter was then recrystallized from ether and hexane (1:3) and thereby yielded the target compound, 1-[4-(9-decenyloxy)phenyl]-4-octylpiperazine.

Identification Data $^1$H-NMR (ppm; CDCl$_3$) δ

0.8 (t, 3H), 1.2-2.5 (m, 3OH), 2.5-3.2 (dt, 8H), 3.8-4.0 (t, 2H), 4.8-5.2 (m, 2H), 5.5-6.2 (m, 1H), 6.7-7.1 (d, 4H)

IR; ν (KBr) cm⁻¹;
2800-3000, 1517, 1251, 1031
MASS (FAB) m/z; 428 (M+1)

Figure 3:
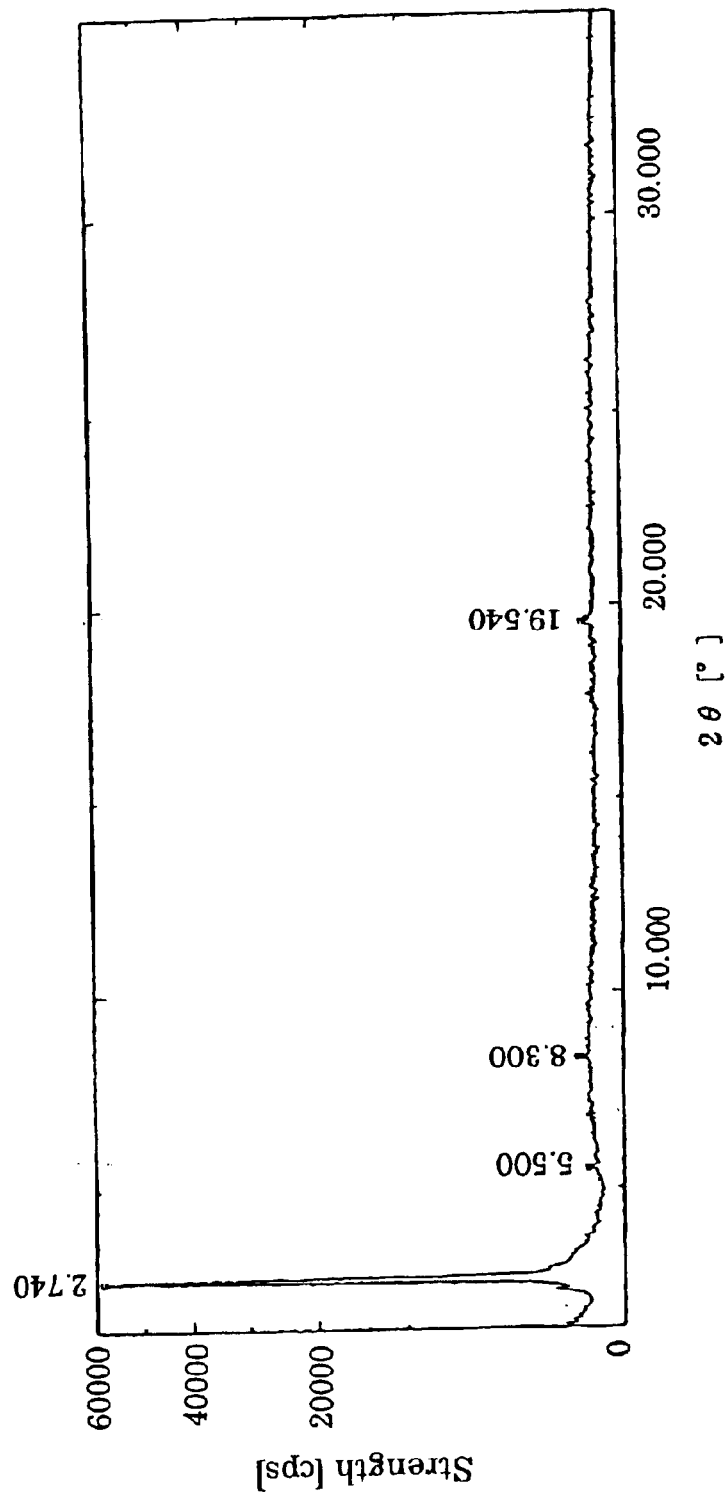
FIG. 3 is an X-ray chart of 1-[4-(9-decenyloxy)phenyl]-4-octylpiperazine obtained in Reference Example 1.

The phase transition temperatures of the above compound were determined, and the results were as follows. In addition, an X-ray chart of the 1-[4-(9-decenyloxy)phenyl]-4-octylpiperazine is shown in FIG. 3.

Cryst $\underset{}{\overset{35°\,C.}{\rightleftarrows}}$ SmB $\underset{}{\overset{68°\,C.}{\rightleftarrows}}$ Iso wherein Cryst. is a crystal, SmB is smectic B phase, and Iso. is isotropic liquid.

Reference Example 2
Preparation of 1-[4-(9-decenyloxy)phenyl]-4-decylpiperazine

The target compound was synthetically prepared in the same manner as in Reference Example 1, except that 0.71 g (0.0032 mol) of decyl bromide was used instead of octyl bromide. The prepared compound was subjected to analyses by ¹H-NMR, MASS, and IR and was identified with 1-[4-(9-decenyloxy)phenyl]-4-decylpiperazine.

The phase transition temperatures of the above compound were determined, and the results were as follows.

Cryst $\underset{}{\overset{45°\,C.}{\rightleftarrows}}$ SmB $\underset{}{\overset{72°\,C.}{\rightleftarrows}}$ Iso Reference Example 3
Preparation of 1-[4-(9-decenyloxy)phenyl]-4-undecylpiperazine The target compound was synthetically prepared in the same manner as in Reference Example 1, except that 0.75 g (0.0032 mol) of undecyl bromide was used instead of octyl bromide. The prepared compound was subjected to analyses by ¹H-NMR, MASS, and IR and was identified with 1-[4-(9-decenyloxy)phenyl]-4-undecylpiperazine.

The phase transition temperatures of the above compound were determined, and the results were as follows.

Cryst $\underset{}{\overset{55°\,C.}{\rightleftarrows}}$ SmB $\underset{}{\overset{70°\,C.}{\rightleftarrows}}$ Iso Reference Example 4
Preparation of 1-[4-(9-decenyloxy)phenyl]-4-dodecylpiperazine The target compound was synthetically prepared in the same manner as in Reference Example 1, except that 0.80 g (0.0032 mol) of dodecyl bromide was used instead of octyl bromide. The prepared compound was subjected to analyses by ¹H-NMR, MASS, and IR and was identified with 1-[4-(9-decenyloxy)phenyl]-4-dodecylpiperazine.

The phase transition temperatures of the above compound were determined, and the results were as follows.

Cryst $\underset{}{\overset{56°\,C.}{\rightleftarrows}}$ SmB $\underset{}{\overset{73°\,C.}{\rightleftarrows}}$ Iso Example 1

ITO films were formed on two glass substrates by vacuum film formation, respectively, and the two glass substrates were bonded with each other with a gap (about 15 μm) using a spacer particle and thereby yielded a cell.

A total of 20 mg of 1-[4-(9-decenyloxy)phenyl]-4-decylpiperazine prepared in Reference Example 2 was injected into the cell at 110° C.

Figure 4:
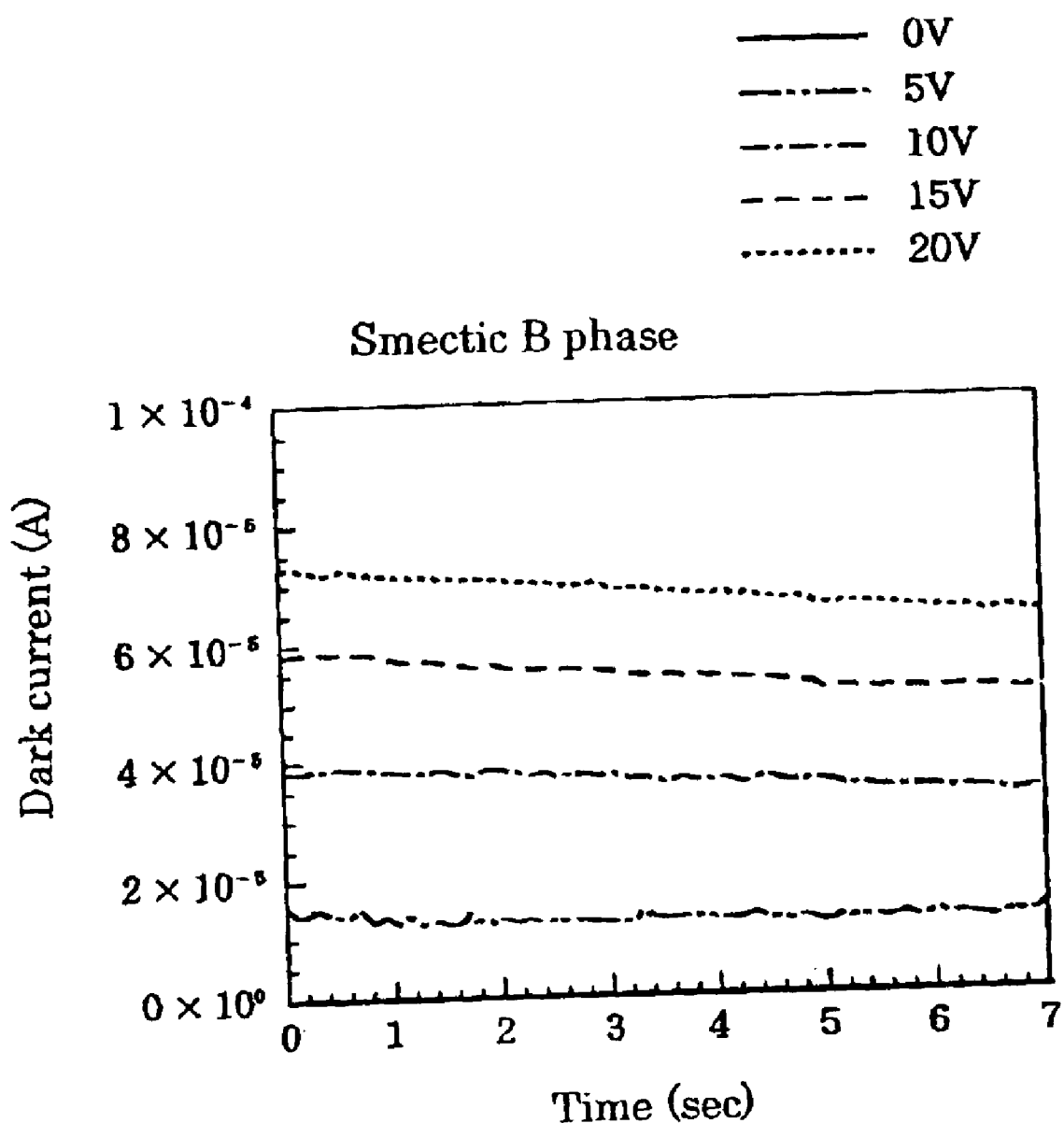
FIG. 4 is a graph showing dark currents of a liquid crystal in smectic B phase in Example 1.
Figure 5:
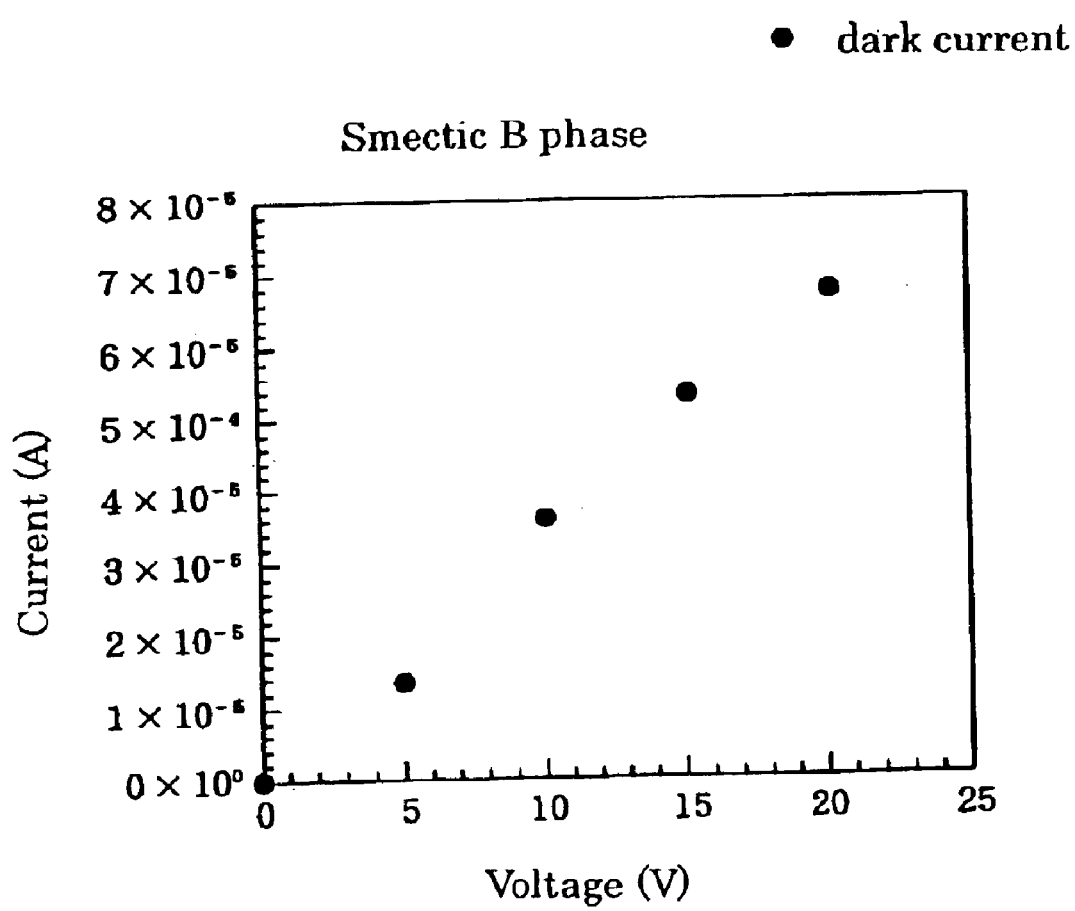
FIG. 5 is a graph showing changes in current with voltage in the liquid crystal in the smectic B phase in Example 1.

Next, dark currents at 0 V, 5 V, 10 V, 15 V, and 20 V, and changes in current with voltage in the smectic B phase (70° C.) were determined. The results are shown in FIGS. 4 and 5.

Figure 6:
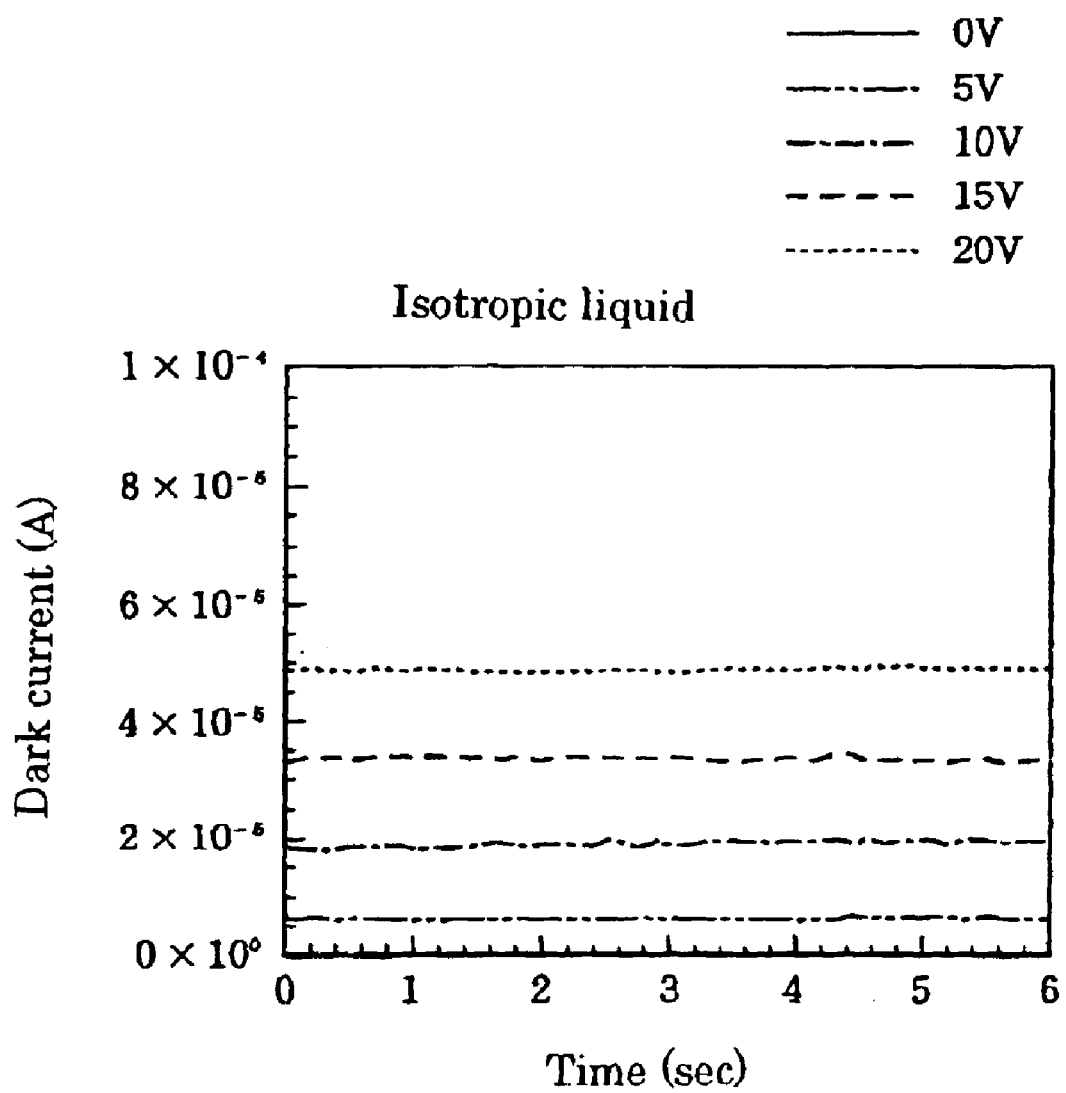
FIG. 6 is a graph showing dark currents of a liquid crystal in a isotropic liquid phase in Example 1.
Figure 7:
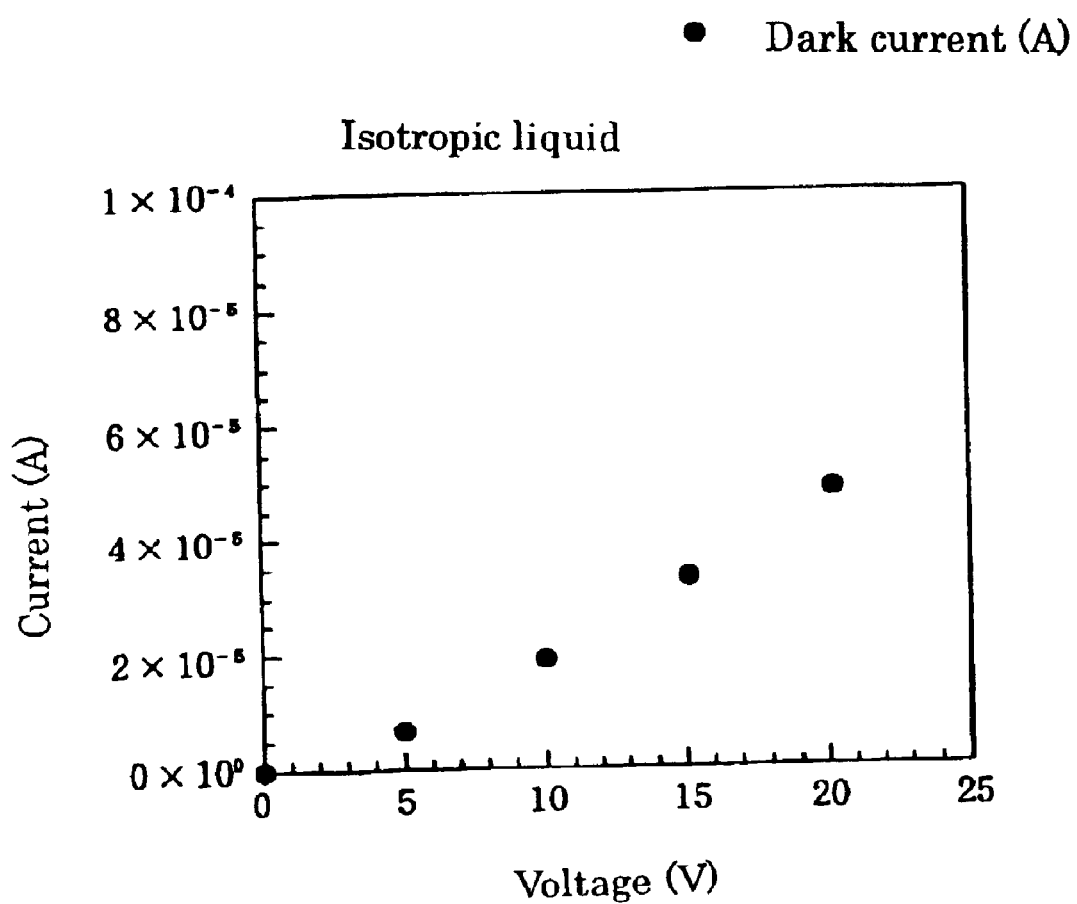
FIG. 7 is a graph showing changes in current with voltage in the liquid crystal in the isotropic liquid phase in Example 1.

Separately, dark currents at 0 V, 5 V, 10 V, 15 V, and 20 V, and changes in current with voltage in the isotropic liquid phase (75° C.) were determined. The results are shown in FIGS. 6 and 7. Current densities were determined based on FIGS. 5 and 7, and the results are shown in Table 1.

TABLE 1

| Applied Voltage (V) | Current density (μA/cm³) | |
| --- | --- | --- |
| | SmB phase (70° C.) | Isotropic liquid (75° C.) |
| 5 | 93 | 38 |
| 10 | 240 | 110 |
| 15 | 360 | 210 |
| 20 | 420 | 300 |

The results in FIGS. 4 to 7 show that charge transportation according to the present invention is not based on photoelectric effect but on the activities of the compound itself, and that higher charge transporting effects are obtained in the smectic B phase.

Example 2

A cell was prepared in the same manner as in Example 1, and 1-[4-(9-decenyloxy)phenyl]-4-decylpiperazine obtained in Reference Example 4 was injected into the cell at 110° C. The compound in the cell was then cooled to 55° C. and thereby yielded a solid having orientation (alignment) of the smectic B phase.

Next, current densities of the resulting solid were determined in the same manner as in Example 1. As a result, current density at 5 V was 103 milliamperes per square centimeter (mA/cm²).

Industrial Applicability

According to the charge transport methods and devices of the present invention as described above, a voltage is applied to a smectic B liquid crystal or a solid formed as a result of phase transition from a smectic phase. By this configuration, the methods and devices have very excellent advantages in that they can transport charges with a current density on the order of microamperes per square centimeter to milliamperes per square centimeter.

What is claimed is:

1. An electric charge transport method comprising the step of applying a voltage to a liquid crystalline compound in a smectic B liquid crystal phase, the liquid crystalline compound exhibiting a smectic B phase as a liquid crystal phase, wherein the liquid crystalline compound is a liquid crystalline compound having a strongly basic moiety in its skeleton.

2. The electric charge transport method according to claim 1, wherein the strongly basic moiety is a monocyclic heterocycle.

3. The electric charge transport method according to claim 2, wherein the monocyclic heterocycle is selected from piperidine, piperazine, pyridine, pyridazine, pyrimidine, and pyrazine.

4. The electric charge transport method according to claim 2 or 3, wherein the monocyclic heterocycle is piperazine.

5. The electric charge transport method according to claim 1, wherein the liquid crystalline compound is a piperazine-containing liquid crystalline compound represented by following general formula (1):

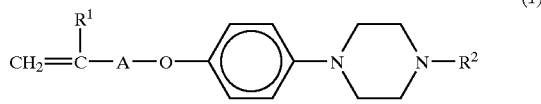

(1)

wherein $R^1$ is a hydrogen atom or a methyl group; $R^2$ is a straight- or branched-chain alkyl group containing from 1 to 22 carbon atoms; and A is an alkylene group.

6. An electric charge transport method comprising the step of applying a voltage to a liquid crystalline compound in a solid state formed as a result of phase transition from a smectic phase, the liquid crystalline compound exhibiting the smectic phase as a liquid crystal phase.

7. The electric charge transport method according to claim 6, wherein the liquid crystalline compound is a smectic liquid crystalline compound having a strongly basic moiety in its skeleton.

8. An electric charge transport device comprising a pair of substrates each having an electrode; a liquid crystal layer sandwiched between the substrates and comprising a liquid crystalline compound having a strongly basic moiety in its skeleton exhibiting smectic B phase as a liquid crystal phase; and means for applying a voltage to the liquid crystalline compound in a smectic B liquid crystal phase to thereby transport charges through the liquid crystal layer.

9. An electric charge transport device comprising a pair of substrates each having an electrode; a liquid crystal layer sandwiched between the substrates, the layer comprising a liquid crystalline compound exhibiting a smectic phase as a liquid crystal phase; and means for applying a voltage to the liquid crystalline compound in a solid state formed as a result of phase transition from the smectic phase to thereby transport charges through the liquid crystal layer.

* * * * *

UNITED STATES PATENT AND TRADEMARK OFFICE
CERTIFICATE OF CORRECTION

PATENT NO. : 6,838,129 B2 Page 1 of 1
APPLICATION NO. : 10/296226
DATED : January 4, 2005
INVENTOR(S) : Yuichiro Haramoto It is certified that error appears in the above-identified patent and that said Letters Patent is hereby corrected as shown below:

On the cover page:
item (73) Assignee change, "Nippon Chemical Industrial Co., Ltd., Tokyo (JP)" to be
-- Nippon Chemical Industrial Co., Ltd., Tokyo (JP); Yuichiro Haramoto, Yamanashi (JP) --

Signed and Sealed this

Twenty-fourth Day of April, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,838,129 B2 |
| APPLICATION NO. | : 10/296226 |
| DATED | : January 4, 2005 |
| INVENTOR(S) | : Yuichiro Haramoto |

It is certified that error appears in the above-identified patent and that said Letters Patent is hereby corrected as shown below:

On the cover page;
item (73) Assignee change, "Nippon Chemical Industrial Co., Ltd., Tokyo (JP)" to be -- Nippon Chemical Industrial Co., Ltd., Tokyo (JP); Yuichiro Haramoto, Yamanashi (JP) --

Signed and Sealed this

First Day of May, 2007

JON W. DUDAS
*Director of the United States Patent and Trademark Office*